(12) United States Patent
Chen et al.

(10) Patent No.: US 12,094,734 B2
(45) Date of Patent: Sep. 17, 2024

(54) WET ETCHING CONTROL SYSTEM, WET ETCHING MACHINE AND WET ETCHING CONTROL METHOD

(71) Applicant: CHANGXIN MEMORY TECHNOLOGIES, INC., Hefei (CN)

(72) Inventors: Hsin-Hung Chen, Hefei (CN); Yen-Teng Huang, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 359 days.

(21) Appl. No.: 17/408,652

(22) Filed: Aug. 23, 2021

(65) Prior Publication Data
US 2022/0076967 A1    Mar. 10, 2022

Related U.S. Application Data

(63) Continuation of application No. PCT/CN2021/100583, filed on Jun. 17, 2021.

(30) Foreign Application Priority Data

Sep. 10, 2020    (CN) .......................... 202010947256.9

(51) Int. Cl.
*H01L 21/67*    (2006.01)
*H01L 21/306*    (2006.01)

(52) U.S. Cl.
CPC .... *H01L 21/6708* (2013.01); *H01L 21/30604* (2013.01); *H01L 21/67023* (2013.01); *H01L 21/67253* (2013.01)

(58) Field of Classification Search
None
See application file for complete search history.

(56) References Cited

U.S. PATENT DOCUMENTS

| | | | | |
|---|---|---|---|---|
| 5,035,765 | A * | 7/1991 | Haas ......................... | C23F 1/08 216/93 |
| 5,416,552 | A * | 5/1995 | Fakler .................... | G03D 3/065 396/626 |
| 5,560,838 | A * | 10/1996 | Allies ...................... | C01G 3/02 216/93 |
| 5,779,927 | A * | 7/1998 | Lo ......................... | B24B 37/013 216/84 |

(Continued)

FOREIGN PATENT DOCUMENTS

| CN | 106356316 A | 1/2017 |
|---|---|---|
| CN | 208833444 U | 5/2019 |

(Continued)

*Primary Examiner* — Sylvia MaCarthur
(74) *Attorney, Agent, or Firm* — Kilpatrick Townsend & Stockton LLP

(57) ABSTRACT

A wet etching control system includes a liquid level detector, an etching agent spraying component, a cleaning agent spraying component and controller. The liquid level detector is configured to detect a liquid level of leakage liquid in a leakage liquid collection tank, and the controller is configured to control the etching agent spraying component to stop a spraying of an etching agent onto a surface of a wafer, and control the cleaning agent spraying component to spray a cleaning agent onto the surface of the wafer when the liquid level of the leakage liquid is greater than a first preset value.

15 Claims, 4 Drawing Sheets

(56) References Cited

U.S. PATENT DOCUMENTS

| | | | | |
|---|---|---|---|---|
| 6,257,965 | B1* | 7/2001 | Kamikubo | B24B 37/04 |
| | | | | 451/60 |
| 6,616,014 | B1* | 9/2003 | Pozniak | B24B 37/04 |
| | | | | 222/129.3 |
| 10,354,866 | B2* | 7/2019 | Zurutuza Elorza | ......... |
| | | | | H01L 21/67253 |
| 10,809,620 | B1* | 10/2020 | Carcasi | H01L 21/67253 |
| 11,141,832 | B2* | 10/2021 | Watanabe | B24B 57/02 |
| 2002/0197079 | A1* | 12/2002 | Nakagawa | H01L 21/67253 |
| | | | | 396/564 |
| 2016/0064257 | A1* | 3/2016 | Nonaka | H01L 21/6708 |
| | | | | 134/102.1 |
| 2016/0233082 | A1* | 8/2016 | Yano | C23G 1/24 |
| 2022/0076967 | A1* | 3/2022 | Chen | H01L 21/30604 |

FOREIGN PATENT DOCUMENTS

| | | | |
|---|---|---|---|
| CN | 109950645 | A | 6/2019 |
| CN | 209487474 | U | 10/2019 |
| CN | 110534452 | A | 12/2019 |
| CN | 106338846 | B | 1/2020 |

\* cited by examiner

WET ETCHING CONTROL SYSTEM, WET ETCHING MACHINE AND WET ETCHING CONTROL METHOD

CROSS-REFERENCE TO RELATED APPLICATIONS

This application is a continuation application of International Patent Application No. PCT/CN2021/100583, filed on Jun. 17, 2021 and entitled "WET ETCHING CONTROL SYSTEM, WET ETCHING MACHINE AND WET ETCHING CONTROL METHOD", which claims priority to Chinese patent application No. 202010947256.9, filed on Sep. 10, 2020 and entitled "WET ETCHING CONTROL SYSTEM, WET ETCHING MACHINE AND WET ETCHING CONTROL METHOD". The contents of International Patent Application No. PCT/CN2021/100583 and Chinese Patent Application No. 202010947256.9 are hereby incorporated by reference in their entireties.

TECHNICAL FIELD

This application relates to a manufacturing technology of semiconductor integrated circuits, in particular to a wet etching control system, a wet etching machine and a wet etching control method for a wafer.

BACKGROUND

Wet etching is a preparation method for selectively removing unnecessary materials from a surface of a wafer through a chemical method, and widely applied to a semiconductor manufacturing industry. The wet etching includes batch wet etching and single-sheet wet etching, the batch wet etching may usually etch a plurality of wafers, and the single-sheet set etching only etches one wafer at a time. Since the wafers prepared by the batch wet etching cannot meet the requirement of smaller line width, for example, the requirement of 22 nm level, the wafers prepared by the batch wet etching gradually quit the historical stage. Since the single-sheet wet etching can meet the requirement of smaller line width, the single-sheet wet etching gradually becomes a mainstream manufacturing process.

A single-sheet wet etching machine in the related art includes an etching chamber and a waste liquid collection system. The wafer is etched by an etching agent in the etching chamber, the etching agent after etching the wafer forms a waste liquid, and the waste liquid is collected through the waste liquid collection system. When the waste liquid collection system leaks the waste liquid, the whole single-sheet wet etching machine will shut down, thereby preventing the highly corrosive waste liquid from leaking always, and improving the using safety of the single-sheet wet etching machine.

However, when the whole single-sheet wet etching machine shuts down due to the leakage of the waste liquid, the etching agent is still adhered to a surface of the wafer, and the etching agent stays at the surface of the wafer for a long time, thereby easily causing an excessive etching depth on the surface of the wafer, and causing a reduced qualified rate of a finished product.

SUMMARY

In view of the abovementioned problem, this application provides a wet etching control system, a wet etching machine and a wet etching control method, so as to solve the problem of the reduced qualified rate of the wafer.

In order to achieve the above object, embodiments of this application provide the following technical solution.

According to a first aspect, embodiments of this application provide a wet etching control system, including a liquid level detector, an etching agent spraying component, a cleaning agent spraying component and a controller.

The liquid level detector is configured to detect a liquid level of leakage liquid in a leakage liquid collection tank.

The etching agent spraying component is configured to spray an etching agent onto a surface of a wafer.

The cleaning agent spraying component is configured to spray a cleaning agent onto the surface of the wafer.

The controller is configured to control the etching agent spraying component to stop the spraying of the etching agent onto the surface of the wafer and to control the cleaning agent spraying component to spray the cleaning agent onto the surface of the wafer when the liquid level of the leakage liquid detected by the liquid level detector is greater than a first preset value.

According to a second aspect, this application provides a wet etching machine, including a wet etching control system. The wet etching control system includes a liquid level detector, an etching agent spraying component, a cleaning agent spraying component and a controller.

The liquid level detector is configured to detect a liquid level of leakage liquid in a leakage liquid collection tank.

The etching agent spraying component is configured to spray an etching agent onto a surface of a wafer.

The cleaning agent spraying component is configured to spray a cleaning agent onto the surface of the wafer.

The controller is configured to control the etching agent spraying component to stop the spraying of the etching agent onto the surface of the wafer and to control the cleaning agent spraying component to spray the cleaning agent onto the surface of the wafer when the liquid level of the leakage liquid detected by the liquid level detector is greater than a first preset value.

According to a third aspect, this application further provides a wet etching control method, including the following operations.

A liquid level of leakage liquid in a leakage liquid collection tank is detected.

When the liquid level of the leakage liquid is greater than a first preset value, an etching agent is controlled to stop a spraying of the etching agent onto a wafer, and a cleaning agent is controlled to be sprayed onto the wafer.

BRIEF DESCRIPTION OF THE DRAWINGS

To better clarity the technical solution of the embodiments of this application, the drawings required to illustrate the embodiments will be simply described blow. It is apparent that the drawings described below merely illustrate some embodiments of this application. Those of ordinary skill in the art can obtain other drawings without creative labor on the basis of those drawings.

LIST OF REFERENCE SYMBOLS

Figure 1:
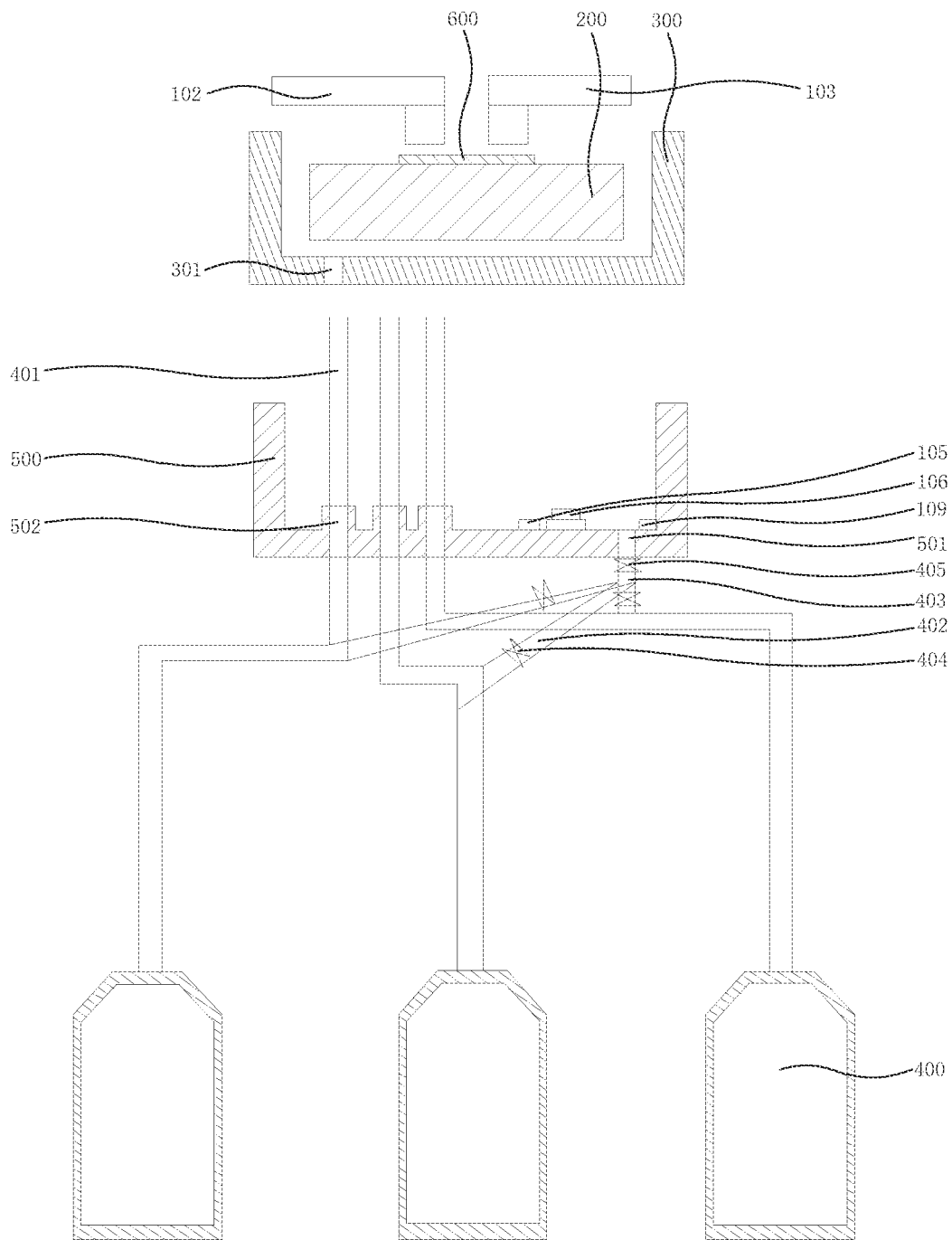
FIG. 1 is a partial section view of a single-sheet wet etching machine according to an embodiment.

100: wet etching control system; 101: liquid level detector; 102: etching agent spraying component; 103: cleaning agent spraying component; 104: controller; 105: first leakage liquid sensor; 106: second leakage liquid sensor; 107: air supply component; 108: alarm component; 109: PH value detector; 200: bearing platform; 300: collector; 301: drainage outlet; 400: waste liquid tank; 401: waste discharge pipeline; 402: waste discharge branch pipe; 403: main pipe; 404: switching valve; 405: main valve; 500: leakage liquid collection tank; 501: waste discharge hole; 502: through hole; 600; wafer.

DETAILED DESCRIPTION

In the related art, a single-sheet wet etching machine includes an etching chamber and a waste liquid collection system. An etching agent nozzle, a collector and a rotatable bearing platform are arranged in the etching chamber. A wafer is arranged on the bearing platform, the etching agent nozzle sprays the etching agent onto the wafer, so that the etching agent reacts with a part of the surface of the wafer that is not protected by photoresist. During the etching, the bearing platform can drive the wafer into rotation, so that the etching agent sprayed onto the surface of the wafer is thrown into the collector under the action of centrifugal force, and the etching agent is discharged into different waste liquid tanks through a waste discharge pipeline.

Through research, the inventor of this disclosure has found that, in some single-sheet wet etching machines in the related art, liquid leakage may occur in the collector connected to the wet etching machine and the waste discharge pipeline of the waste liquid tank. The leakage waste liquid will be collected into the leakage liquid collection tank surrounding the waste discharge pipeline. When the leakage liquid collected in the leakage liquid collection tank reaches to a liquid level height set by the system, a controller of the wet etching machine will control the wet etching machine to shut down, so as to overhaul the waste discharge pipeline.

However, when the wet etching machine shuts down, the etching agent sill stays on the surface of the wafer. The etching agent stays on the surface of the wafer for a long time, thereby easily causing an excessive etching depth on the surface of the wafer, and causing a reduced qualified rate of a finished product. Therefore, this application adds a cleaning operation before the shutting down, so as to remove the etching agent on the surface of the wafer, avoid over etching of the wafer and improve the qualified rate of the finished product. Specifically, a liquid level detector capable of detecting different liquid level heights is arranged in the leakage liquid collection tank of the wet etching machine, and the liquid level height of the leakage liquid leaked from the waste discharge pipeline of the wet etching machine to the leakage liquid collection tank is detected through the liquid level detector. When the liquid level height is greater than a first preset value, the etching is stopped and the cleaning agent is sprayed onto the surface of the wafer that is being etched, so that the etching agent on the surface of the wafer is removed before the whole wet etching machine is shut down and overhauled, thereby preventing the wafer etching from exceeding a design time. The etching depth on the surface of the wafer does not exceed the preparation requirement, and after troubleshooting, the subsequent process operation may be performed on the wafer Therefore, the qualified rate of the finished product is improved, and the manufacturing cost is reduced.

In order to make the above objectives, features, and advantages of the embodiments of this application more clear and understandable, the technical solution in the embodiments of this application will be clearly and completely described below in conjunction with the drawings. It is apparent that the described embodiments are only some embodiments of this application instead of all embodiments. Based on the embodiments of this application, other embodiments obtained by those of ordinary skill in the art without creative labor fall in the protection scope of this application. Various embodiments or enforcement modes in the specification are described in a progressive manner, the difference between each embodiment and other embodiments is mainly illustrated, and the same or similar parts of various embodiments may be mutually referred.

First Embodiment

Figure 3:
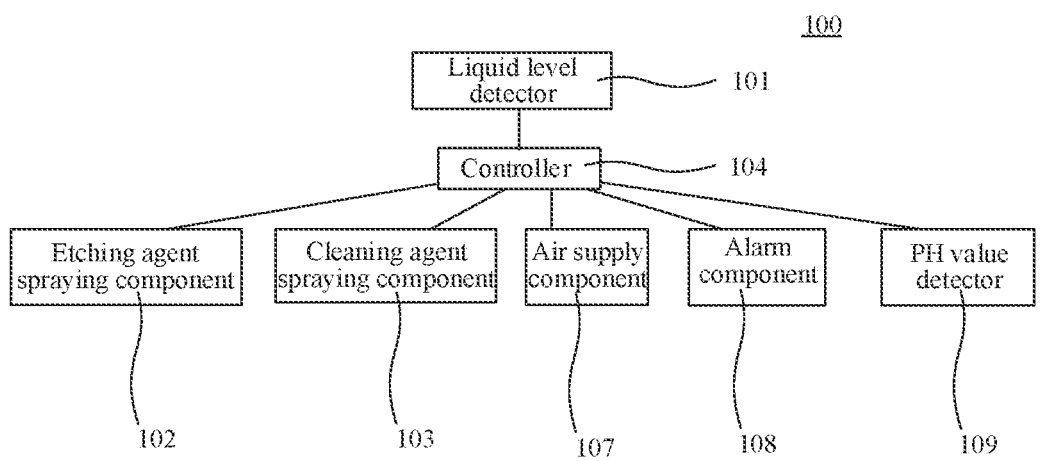
FIG. 3 is a schematic diagram of a wet etching control system according to an embodiment.

FIG. 1 is a partial section view of a single-sheet wet etching machine according to an embodiment, and FIG. 3 is a schematic diagram of a wet etching control system according to an embodiment. As shown in FIG. 1, embodiments of this application provide a wet etching machine. As shown in FIG. 3, embodiments of this application provide a wet etching system. The wet etching machine includes a wet etching control system 100, a bearing platform 200 configured to bearing a wafer 600 to be etched, a collector 300 configured to collect an etching waste liquid or a cleaning waste liquid, a plurality of waste liquid tanks 400 configured to store the etching waste liquid or the cleaning waste liquid, a waste discharge pipeline 401 configured to discharge the etching waste liquid from the collector 300 into the waste liquid tanks 400, and a leakage liquid collection tank 500 disposed around the waste discharge pipeline 401.

It should be noted that the etching can be finished through a plurality of acid pickling or alkali washing when the wafer 600 is etched through the wet etching method. According to the different process requirements, each acid pickling or alkali washing adopts different etching agents. Moreover, the cleaning agent is required to clean the wafer 600 before and after each acid pickling or alkali washing, thus different etching agents needs to be used in the whole etching process of the wafer 600. Due to different PH values and compositions, these different etching agents have different subsequent processing operations. Therefore, the waste liquid generated by the different etching agents after etching needs to be collected into different waste liquid tanks 400, that is, the different waste liquid tanks 400 collect different etching agents and cleaning agents through different waste discharge pipelines 401.

As shown in FIG. 1, the bearing platform 200 for bearing the wafer 600 to be etched is rotatable, so that the etching depth is uniform and the etching effect is better. In some embodiments, the collector 300 is movable along a vertical direction, so that a drainage outlet 301 on the collector 300 communicates with different waste discharge pipelines 401, and the waste liquid generated by different etching agents is collected into different waste liquid tanks. It should be noted that this collector 300 is merely a feasible embodiment, the specific structure of the collector 300 may be in any form in the related art, which are not described herein. The collector 300 may, for example, have a revolution shape, which is configured to collect the waste liquid falling from the surface of the wafer 600.

In some embodiments, the waste liquid tank 400 may be a common cylindrical tank, or have a rectangular box shape, or be formed by a waste liquid pool. One end of the waste discharge pipeline 401 communicates with the collector 300, and the other end of the waste discharge pipeline 401 communicates with the waste liquid tank 400.

Figure 2:
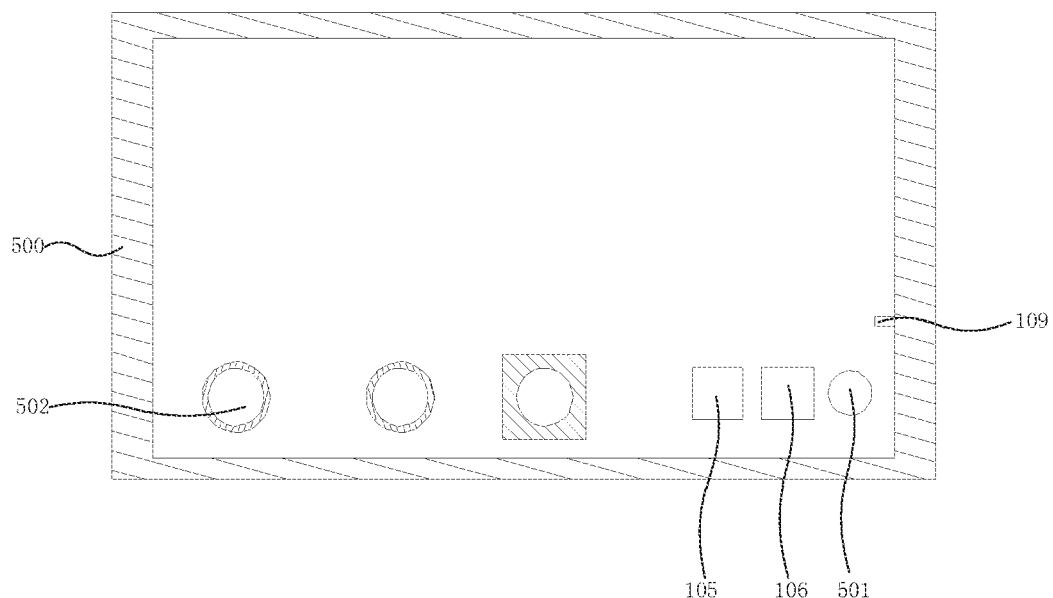
FIG. 2 is a section view of a leakage liquid collection tank according to an embodiment.

As shown in FIG. 1 and FIG. 2, through holes 502 are disposed at the bottom of the waste liquid collection tank 500, the waste discharge pipelines 401 are inserted in the through holes 502, so that the waste liquid in the collector 300 enters the waste liquid tanks 400.

As shown in FIG. 1 and FIG. 3, the wet etching control system 100 provided by the embodiment includes a liquid level detector 101, an etching agent spraying component 102, a cleaning agent spraying component 103 and a controller 104. The liquid level detector 101 is configured to detect a liquid level of leakage liquid in the leakage liquid collection tank 500. The etching agent spraying component 102 is configured to spray an etching agent onto a surface of the wafer 600. The cleaning agent spraying component 103 is configured to spray a cleaning agent onto the surface of the wafer 600.

The etching agent spraying component 102 and the cleaning agent spraying component 103 are arranged above the bearing platform 200. The etching agent spraying component 102 may spray different etching agents, such as hydrofluoric acid, sulfuric acid, nitric acid and the like, onto the surface of the wafer 600. The cleaning agent spraying component 103 may spray the cleaning agent onto the surface of the wafer 600 so as to remove impurities or cleaning agent on the surface of the wafer 600. The cleaning agent may be for example deionized water.

The controller 104 is configured to control the etching agent spraying component 102 to stop the spraying of the etching agent onto the surface of the wafer 600 and to control the cleaning agent spraying component 103 to spray the cleaning agent onto the surface of the wafer 600 when the liquid level of the leakage liquid detected by the liquid level detector 101 is greater than a first preset value, so as to clean the etching agent staying on the surface of the wafer 600. Therefore, over etching caused by the etching agent staying on the surface of the wafer 600 for a long time is prevented, the qualified rate of the finished product is improved, and the manufacturing cost is reduced.

The liquid level detector 101 may be for example a leakage liquid sensor or a liquid level sensor. Herein, the leakage liquid sensor is sensor which generates an electric signal when it is in contact with liquid and which does not generate an electric signal when it is not in contact with liquid. The leakage liquid sensors with different heights are installed in the leakage liquid collection tank 500 or the leakage liquid sensors with the same height are installed at different heights of the leakage liquid collection tank 500, so that the different heights of the liquid level of the leakage liquid in the leakage liquid collection tank 500 may be detected. After the liquid level of the leakage liquid collected in the leakage liquid collection tank 500 reaches to a first preset value, the surface of the wafer 600 is cleaned before the shutting down, thereby preventing the problem of over etching of the wafer 600, improving the qualified rate of the finished product and reducing the manufacturing cost.

In some embodiments, the first preset value may be slightly greater than 0, so that the etching agent is stopped to be sprayed onto the wafer 600 in a case that less, even micro leakage liquid is collected in the leakage liquid collection tank 500, and the cleaning agent is sprayed onto the surface of the wafer 600 so as to clear the etching agent on the surface of the wafer 600, thereby effectively reducing a risk of an over etching of the wafer 600 caused by a leakage liquid fault and improving the qualified rate of the finished product. Certainly, in another example, the first preset value may be a suitable value greater than 0, so as to more appropriately perform the cleaning operation after the liquid leaks.

In the wet etching control system 100 provided by the embodiments of this application, the liquid level of the leakage liquid in the leakage liquid collection tank 500 is detected through the liquid level detector 101, and when the detected liquid level height of the leakage liquid is greater than the first preset value, the controller 104 is adopted to control the etching agent spraying component 102 to stop the spraying of the etching agent, and control the cleaning agent spraying component 103 to spray the cleaning agent. When the liquid level of the leakage liquid in the leakage liquid collection tank 500 is greater than the first preset value, the surface of the wafer 600 to be etched is firstly cleaned. Therefore, the etching agent can be effectively prevented from staying on the surface of the wafer 600 to be etched for longer than the designed time, and the etching depth on the surface of the wafer 600 will not exceed a designed depth. After troubleshooting, a subsequent process may be performed on the wafer 600, thereby improving the qualified rate of the finished product and reducing the manufacturing cost.

It should be understood that the controller 104 is further configured to control the whole wet etching machine to shut down when the liquid level of the leakage liquid detected by the liquid level detector 101 is greater than a second preset value, namely, when the liquid level in the leakage liquid collection tank 500 is greater than the second preset value, so as to overhaul the waste discharge pipeline 401. The second preset value is greater than the first preset value. When the liquid level of the leakage liquid detected by the liquid level detector 101 is greater than the second preset value, the controller 104 controls the whole wet etching machine to shut down, so that the leakage liquid in the leakage liquid collection tank 500 does not leak through overflowing the height of the leakage liquid collection tank 500, and the whole production process for etching and preparing the wafer 600 is safer.

In some embodiments, one liquid level detector 101 may be adopted to detect the different liquid level heights of the leakage liquid. For example, an infrared liquid level sensor or a magnetic liquid sensor may be adopted. In another embodiment, there are two liquid level detectors 101, and each of the two liquid level detectors 101 is configured to detect a respective one of two different liquid level heights in the leakage liquid collection tank 500.

Further, as shown in FIG. 1 and FIG. 2, the two liquid level detectors 101 are a first leakage liquid sensor 105 and a second leakage liquid sensor 106, and the installation height of the first leakage liquid sensor 105 is lower than the installation height of the second leakage liquid sensor 106. The liquid level height detected by the first leakage liquid sensor 105 is the first preset value, and the liquid level height detected by the second leakage liquid sensor 106 is the second preset value. The difference between the second preset value and the first preset value may be not greater than 1.5 cm. For example, the difference between the second preset value and the first preset value is equal to 0.8 cm, 1 cm, 1.2 cm, etc. The height difference is beneficial to provide enough time for cleaning the etching agent on the surface of the wafer 600 before the whole wet etching machine shuts down.

In an optional embodiment, the wet etching control system 100 further includes an air supply component 107 in communication with the controller 104. The air supply component 107 is configured to blow air to the surface of the wafer 600. The controller 104 is further configured to control the air supply component 107 to blow air to the surface of the wafer 600 when the cleaning agent spraying component 103 stops spraying the cleaning agent, so as to dry the wafer 600, which improves the qualified rate of the wafer 600.

It should be noted that the controller 104 controls the air supply component 107 to blow air to the wafer 600 after the cleaning agent spraying component 103 executes the cleaning operation. That is to say, after the controller 104 controls the cleaning agent spraying component 103 to spray the cleaning agent to the wafer 600 when the leakage liquid in the leakage liquid collection tank 500 detected by the liquid level detector 101 reaches to the first preset value, the air supply component 107 is controlled to blow air to the wafer 600 so as to dry the wafer 600.

In an optional embodiment, the wet etching control system 100 further includes an alarm component 108 in communication with the controller 104, and the alarm component 108 is configured to send out an alarm signal. Specifically, the controller 104 is configured to control the alarm component 108 to send out a first alarm signal when the liquid level of the leakage liquid detected by the liquid level detector 101 is greater than the first preset value. The alarm signal can remind an equipment engineer that the wet etching machine has a leakage liquid fault, and this fault needs to be treated in time. The alarm signal is one or more of a sound signal, a light signal and an image signal.

In some embodiments, the controller 104 is further configured to control the alarm component 108 to send out a second alarm signal when the liquid level of the leakage liquid detected by the liquid level detector 101 is greater than the second preset value. That is, when the liquid level of the leakage liquid in the leakage liquid collection tank 500 detected by the liquid level detector 101 reaches to the first preset value, the alarm component 108 sends out the first alarm signal. When the liquid level of the leakage liquid in the leakage liquid collection tank 500 detected by the liquid level detector 101 reaches to the second preset value, the alarm component 108 sends out the second alarm signal. Whether the current liquid level of the leakage liquid of the wet etching machine reaches to the first preset value or the second preset value is sent out through different alarm signals, so that an operator may intuitively judge the severity of the leakage liquid fault.

Optionally, after sending out the first alarm signal for a period of time, the alarm component 108 may for example stop automatically. When the alarm component 108 sends out the second alarm signal, the alarm component 108 needs to be manually stopped by the operator. For example, a corresponding stop command may be input to the controller 104, or a corresponding stop key may be triggered.

In an optional embodiment, the wet etching control system 100 further includes a PH value detector 109 configured to detect a PH value of the leakage liquid in the leakage liquid collection tank 500. The controller 104 is further configured to control the leakage liquid in the leakage liquid collection tank 500 to be discharged into an adapted waste liquid tank 400 according to the PH value detected by the PH value detector 109. In this way, the leakage liquid in the leakage liquid collection tank 500 is treated together with the waste liquid in the adapted waste liquid tank, so that the treatment of the leakage liquid in the leakage liquid collection tank 500 is more convenient. That is, the leakage liquid in the leakage liquid collection tank 500 is not needed to be separately treated, so that an operation of treating the leakage liquid in the leakage liquid collection tank 500 is saved. As shown in FIG. 1 and FIG. 2, a PH value sensor that is in communication with the controller 104 is also arranged in the leakage liquid collection tank 500, and the PH value sensor forms the PH value detector 109.

It should be pointed out that, in order to adapt to the waste liquid with different PH values, as shown in FIG. 1, a plurality of waste liquid tanks 400 may be arranged. Taking three waste liquid tanks 400 shown in FIG. 1 as an example below, the waste discharge pipelines 401 are schematically introduced.

Referring to FIG. 1, each of the three waste liquid tanks 400 is connected with an end of a respective one of three waste discharge branch pipes 402, the other end of each of the three waste discharge branch pipes 402 is connected with an end of a main pipe 403, the other end of the main pipe 403 is connected with a waste discharge hole 501 of the leakage liquid collection tank 500. A switching valve 404 is arranged on each waste discharge branch pipe 402, a main valve 405 is arranged on the main pipe 403, and the main valve 405 and the switching valves 404 may be for example a pneumatic valve. Thus, the leakage liquid in the leakage liquid collection tank 500 may be controlled to be discharged into the adapted waste liquid tank 400 by controlling the switching valves 404 and the main valve 405. Taking three waste liquid tanks 400 respectively configured to collect high acidic, approximately neutral and highly alkaline waste liquid as an example below, the collection operation is simply introduced.

When the PH value detected by the PH value sensor is less than or equal to 6, the corresponding switching valve 404 is opened, so that the leakage liquid in the leakage liquid collection tank 500 is collected into the waste liquid tank 400 for storing the acidic waste liquid. When the PH value detected by the PH value sensor is greater than 6 or less than 8, the corresponding switch valve 404 is opened, so that the leakage liquid in the leakage liquid collection tank 500 is collected into the waste liquid tank 400 for storing the neutral waste liquid. When the PH value detected by the PH value sensor is greater than or equal to 8, the corresponding switching valve 404 is opened, so that the leakage liquid in the leakage liquid collection tank 500 is collected into the waste liquid tank 400 for storing the alkaline waste liquid. The switching valves 404 and the main valve 405 may be controlled through the controller 104. When the liquid level of the leakage liquid in the leakage liquid collection tank 500 detected by the liquid level detector 101 is the first preset value, the corresponding switching valve 404 and the main valve 405 are controlled to be opened according to the PH value, and the leakage liquid in the leakage liquid collection tank 500 is timely discharged into the corresponding waste liquid tank 400.

It should be noted that, in order to prevent the waste liquid in the waste liquid tanks 400 from flowing backwards to the leakage liquid collection tank 500, the switching valves 404 and the main valve 405 are arranged to normally closed valves. That is, in a case that there is no leakage liquid in the leakage liquid collection tank 500, the switching valves 404 and the main valve 405 are closed. In a case that there is leakage liquid in the leakage liquid collection tank 500 and the control signal of the controller 104 is received, the switching valves 404 and the main valve 405 are opened.

Second Embodiment

Figure 4:
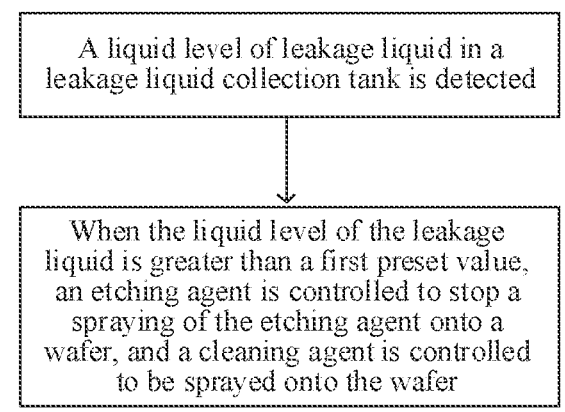
FIG. 4 is a flow chart of a wet etching control method according to an embodiment.

The embodiment further provides a wet etching control method, as shown in FIG. 4, including the following operations.

A liquid level of the leakage liquid in the leakage liquid collection tank 500 is detected.

When the liquid level of the leakage liquid is greater than a first preset value, an etching agent is controlled to stop the spraying of the etching agent onto the wafer 600, and a cleaning agent is controlled to be sprayed onto the wafer 600.

The liquid level height of the leakage liquid in the leakage liquid collection tank 500 may be detected by the abovementioned liquid level detector 101. The first preset value may be for example a value close to 0. The operation that the etching agent is controlled to stop the spraying of the etching agent onto the wafer 600 may be implemented through controlling the abovementioned etching agent spraying component 102 to stop the spraying of the etching agent onto the wafer 600. The operation that the cleaning agent is controlled to be sprayed onto the wafer 600 may be implemented through controlling the abovementioned cleaning agent spraying component 103 to spray the etching agent onto the wafer 600.

According to the wet etching control method provided by this embodiment, when the liquid level of the leakage liquid is greater than the first preset value, the etching agent is controlled to stop the spraying of the etching agent onto the wafer 600. When it is found that the waste discharge pipeline 401 leaks waste liquid, the spraying of the etching agent onto the wafer 600 is firstly stopped, and the cleaning agent is controlled to be sprayed onto the wafer 600. The etching agent on the surface of the wafer 600 being etched is timely removed through the cleaning agent, so that the etching agent will not be adhered on the surface of the wafer 600 for a long time during the shutting down and troubleshooting, and the rejection rate of the wafer 600 caused by excessive etching depth due to long etching time is effectively reduced. At this time, the etching depth on the surface of the wafer 600 is less than a target etching depth. After troubleshooting, the etching depth meeting the requirement may be reached through continuous etching, and the qualified rate of the wafer 600 is improved.

It should be noted that the etching agent spraying component 102 of the wet etching machine may currently spray the etching agent onto the surface of the wafer 600 or may stop the spraying of the etching agent when the liquid level detector 101 detects that the waste discharge pipeline 401 occurs the leakage. At this time, in either state, a closing signal may be sent out to the etching agent spraying component 102 to control the etching agent spraying component 102 to be closed and to be maintained in a closed state. Certainly, in some optional examples, the state of the etching agent spraying component 102 may be detected. When the etching agent spraying component 102 is in an open state, the closing signal is sent to the etching agent spraying component 102. When the etching agent spraying component 102 is in a closed state, a signal for maintaining closing is sent to the etching agent spraying component 102 or no signal may be sent. It should be pointed out that regardless of whether a signal is sent to the etching agent spraying component 102 or what type of closing signal is sent, it is indicated as stopping etching.

In some optional embodiments, when the liquid level of the leakage liquid is greater than the second preset value, the whole wet etching machine is controlled to be shut down. The second preset value is greater than the first preset value. When the liquid level of the leakage liquid is greater than the second preset value, the whole control is controlled to be shut down, so that the whole process of the wet etching is safer. That is to say, the waste liquid collected in the waste liquid collection tank 500 may be effectively prevented from overflowing from the leakage liquid collection tank 500. The waste liquid collected in the leakage liquid collection tank 500 has two liquid level heights. The first preset value and the second preset value may be detected by the abovementioned two leakage liquid sensors. Further, the difference between the second preset value and the first preset value is not greater than 1.5 cm. For example, the difference between the second preset value and the first preset value is 0.7 cm, 1 cm or 1.1 cm.

In this embodiment, the wet etching control method further includes the following operation. When the spraying of the cleaning agent onto the wafer 600 is stopped, the air is controlled to be blown to the wafer 600, that is, the cleaning agent remaining on the surface of the wafer 600 is dried. The cleaned wafer 600 is subjected to air drying so as to increase the qualified rate of the prepared wafer 600. The cleaning agent remaining on the surface of the wafer 600 is subjected to air drying, and the abovementioned air supply component 107 may be adopted to blow air to the surface of the wafer 600. The condition for stopping the spraying of the cleaning agent onto the wafer 600 may be a time signal. For example, the cleaning is stopped after the cleaning is performed for a fixed time. Similarly, stopping blowing air to the surface of the wafer 600 may be a time signal. For example, blowing air is stopped after air drying is performed for a fixed time.

In an optional embodiment, the wet etching control method further includes the following operation. When the liquid level of the leakage liquid is greater than the first preset value, the alarm signal is sent out. The alarm signal may be sent out through the abovementioned alarm component 108. The alarm signal may remind that the waste discharge pipeline 401 leaks the waste liquid. The alarm signal is one or more of a sound signal, a light signal and an image signal.

In some embodiments, when the liquid level height of the leakage liquid is greater than the first preset value, the alarm component 108 is controlled to send out the first alarm signal. When the liquid level height is higher than the second present value, the alarm component 108 is controlled to send out the second alarm signal. After sending out for a period of time, the first alarm signal is automatically stopped, and the second alarm signal must be manually stopped, thereby ensuring that an operator may timely eliminate the leakage liquid fault of the waste discharge pipeline 401.

In an optional embodiment, the wet etching control method provided by this embodiment further includes the following operations. The PH value of the leakage liquid in the leakage liquid collection tank 500 is detected. The leakage liquid in the leakage liquid collection tank 500 is controlled to be discharged into an adapted waste liquid tank 400 according to the detected PH value of the leakage liquid. The PH value may be detected through the abovementioned PH value sensor. According to the PH value detected by the PH value sensor, the leakage liquid in the leakage liquid collection tank 500 is controlled to be discharged into the adapted waste liquid tank 400, so that the leakage liquid in the leakage liquid collection tank 500 may be treated together with the waste liquid in the matched waste liquid tank, and the treatment of the leakage liquid in the leakage liquid collection tank 500 is more convenient. That is, the leakage liquid in the leakage liquid collection tank 500 does not need to be separately treated, so that the operation of treating the leakage liquid in the leakage liquid collection tank 500 is saved.

According to the wet etching control system 100, the wet etching machine and the wet etching control method in the embodiments, when the liquid level height of the waste liquid in the leakage liquid collection tank 500 is greater than the first preset value, the etching is stopped and the cleaning agent is sprayed to the wafer 600 that is currently etched, so that the wafer 600 does not occur the over etching phenomenon due to the shutdown of the wet etching machine caused by the leakage liquid. Therefore, the wafer 600 that is being etched when the leakage liquid fault is occurred may be processed in the subsequent process after the leakage liquid fault is eliminated, thereby improving the qualified rate of the finished product and reducing the manufacturing cost.

In the description of the specification, the descriptions of reference terms "one embodiment", "some embodiments", "example", "specific example", or "some examples" intend to be included in at least one embodiment or example of this application in combination with the specific characteristics, structures, materials or characteristics of this embodiment or example. In this specification, the schematic expression of the above terms does not need for the same embodiment or example. Moreover, the described specific characteristics, structures, materials or characteristics may be combined in one or more embodiments or examples in a suitable manner. In addition, without conflicting, those skilled in the art may combine and assemble different embodiments or examples and the characteristics of the different embodiments or examples.

Finally, it should be noted that the above embodiments are merely used for illustrating the technical solution of this application instead of limiting it. Although this application is described in details with reference to the abovementioned embodiments. Those of ordinary skill in the art should understand that they can still make modifications to the technical solution recorded in the abovementioned embodiments, or make equivalent replacements to part or all of technical characteristics. However, these modifications or replacement do not separate the nature of the corresponding technical solution from the scope of the technical solution of various embodiments of this application.

The invention claimed is:

1. A wet etching control system, comprising a liquid level detector, an etching agent nozzle, a cleaning agent nozzle, a controller and a PH value detector,
the liquid level detector is configured to detect a liquid level of leakage liquid in a leakage liquid collection tank, the liquid level detector comprises a first leakage liquid sensor and a second leakage liquid sensor, wherein the first leakage liquid sensor and the second leakage liquid sensor have a height difference,
the etching agent nozzle is configured to spray an etching agent onto a surface of a wafer,
the cleaning agent nozzle is configured to spray a cleaning agent onto the surface of the wafer,
the controller is configured to control the etching agent nozzle to stop the spraying of the etching agent onto the surface of the wafer and to control the cleaning agent nozzle to spray the cleaning agent onto the surface of the wafer when the liquid level of the leakage liquid detected by the first leakage liquid sensor is greater than a first preset value,
the controller is further configured to control a wet etching machine to shut down when the liquid level of the leakage liquid detected by the second leakage liquid sensor is greater than a second preset value, wherein the second preset value is greater than the first preset value, the height difference is selected to provide a specified amount of time for cleaning the etching agent on the surface of the wafer before the wet etching machine shuts down,
the PH value detector is configured to detect a PH value of the leakage liquid in the leakage liquid collection tank, and
the controller is further configured to control the leakage liquid in the leakage liquid collection tank to be discharged into a waste liquid tank according to the PH value detected by the PH value detector.

2. The wet etching control system of claim 1, further comprising:
a fan configured to blow air to the surface of the wafer,
the controller is further configured to control the fan to blow the air to the surface of the wafer when the cleaning agent nozzle stops spraying the cleaning agent.

3. The wet etching control system of claim 1, further comprising:
an alarm signal generator configured to send out an alarm signal,
the controller is further configured to control the alarm signal generator to send out a first alarm signal when the liquid level of the leakage liquid detected by the first leakage liquid sensor is greater than the first preset value.

4. The wet etching control system of claim 3, wherein the controller is further configured to control the alarm signal generator to send out a second alarm signal when the liquid level of the leakage liquid detected by the second leakage liquid sensor is greater than the second preset value.

5. The wet etching control system of claim 3, wherein the alarm signal is one or more of a sound signal, a light signal or an image signal.

6. A method for controlling a wet etching using the wet etching control system according to claim 1, comprising:
detecting the liquid level of the leakage liquid in the leakage liquid collection tank; and
controlling stopping the spraying of the etching agent onto the wafer, and controlling the spraying of the cleaning agent onto the wafer when the liquid level of the leakage liquid is greater than the first preset value.

7. The method of claim 6, further comprising:
controlling blowing air to the wafer responsive to stopping the spraying of the cleaning agent onto the wafer.

8. The method of claim 7, comprising:
detecting the PH value of the leakage liquid in the leakage liquid collection tank; and
controlling the leakage liquid in the leakage liquid collection tank to be discharged into the waste liquid tank according to the detected PH value of the leakage liquid.

9. The method of claim 6, further comprising: controlling the wet etching machine to shut down when the liquid level of the leakage liquid is greater than the second preset value.

10. The method of claim 9, further comprising:
controlling an alarm signal generator to send out a first alarm signal when the liquid level of the leakage liquid is greater than the first preset value.

11. The method of claim 10, further comprising:
controlling the alarm signal generator to send out a second alarm signal when the liquid level of the leakage liquid is greater than the second preset value.

12. The method of claim 11, wherein at least one of the first alarm signal or the second alarm signal is one or more of a sound signal, a light signal or an image signal.

13. The method of claim 9, comprising:
detecting the PH value of the leakage liquid in the leakage liquid collection tank; and
controlling the leakage liquid in the leakage liquid collection tank to be discharged into the waste liquid tank according to the detected PH value of the leakage liquid.

14. The method of claim 6, comprising:
detecting the PH value of the leakage liquid in the leakage liquid collection tank; and
controlling the leakage liquid in the leakage liquid collection tank to be discharged into the waste liquid tank according to the detected PH value of the leakage liquid.

15. A wet etching machine, comprising a wet etching control system, wherein the wet etching control system comprises a liquid level detector, an etching agent nozzle, a cleaning agent nozzle, a controller and a PH value detector,
the liquid level detector is configured to detect a liquid level of leakage liquid in a leakage liquid collection tank, the liquid level detector comprises a first leakage liquid sensor and a second leakage liquid sensor, wherein the first leakage liquid sensor and the second leakage liquid sensor have a height difference,
the etching agent nozzle is configured to spray an etching agent onto a surface of a wafer,
the cleaning agent nozzle is configured to spray a cleaning agent onto the surface of the wafer,
the controller is configured to control the etching agent nozzle to stop the spraying of the etching agent onto the surface of the wafer and to control the cleaning agent nozzle to spray the cleaning agent onto the surface of the wafer when the liquid level of the leakage liquid detected by the first leakage liquid sensor is greater than a first preset value,
the controller is further configured to control a wet etching machine to shut down when the liquid level of the leakage liquid detected by the second leakage liquid sensor is greater than a second preset value, wherein the second preset value is greater than the first preset value, the height difference is selected to provide a specified amount of time for cleaning the etching agent on the surface of the wafer before the wet etching machine shuts down,
the PH value detector is configured to detect a PH value of the leakage liquid in the leakage liquid collection tank, and
the controller is further configured to control the leakage liquid in the leakage liquid collection tank to be discharged into a waste liquid tank according to the PH value detected by the PH value detector.

* * * * *